United States Patent
Shin et al.

(10) Patent No.: US 11,868,266 B2
(45) Date of Patent: Jan. 9, 2024

(54) BANK REDISTRIBUTION BASED ON POWER CONSUMPTION

(71) Applicant: Micron Technology, Inc., Boise, ID (US)

(72) Inventors: Ji-Hye G Shin, Palo Alto, CA (US); Kazuaki Ohara, San Jose, CA (US); Rosa M. Avila-Hernandez, Boise, ID (US); Rachael R. Skreen, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 212 days.

(21) Appl. No.: 17/198,902

(22) Filed: Mar. 11, 2021

(65) Prior Publication Data

US 2022/0292025 A1    Sep. 15, 2022

(51) Int. Cl.
| | | |
|---|---|---|
| *G06F 12/10* | (2016.01) | |
| *G06F 1/3234* | (2019.01) | |
| *G11C 7/10* | (2006.01) | |

(52) U.S. Cl.
CPC ............ *G06F 12/10* (2013.01); *G06F 1/3275* (2013.01); *G06F 2212/657* (2013.01); *G11C 7/10* (2013.01)

(58) Field of Classification Search
CPC ... G06F 1/26; G06F 1/32; G06F 1/263; G06F 1/3203; G06F 1/189; G06F 12/10; G06F 12/0246
USPC ...................... 711/203, 100, 5, 151, E12.001
See application file for complete search history.

(56) References Cited

U.S. PATENT DOCUMENTS

| | | | | |
|---|---|---|---|---|
| 6,539,487 | B1* | 3/2003 | Fields, Jr. ............ | G06F 1/3225 713/340 |
| 9,201,608 | B2 | 12/2015 | Hendry et al. | |
| 2010/0235590 | A1* | 9/2010 | Tam ...................... | G06F 13/161 711/149 |
| 2010/0271892 | A1* | 10/2010 | Chu ........................ | G11C 7/12 365/230.03 |
| 2011/0252180 | A1* | 10/2011 | Hendry ............... | G06F 16/1737 711/3 |
| 2014/0195837 | A1* | 7/2014 | Park ...................... | G06F 1/3287 713/323 |

(Continued)

OTHER PUBLICATIONS

Acar et al., "Beyond CPU: Considering Memory Power Consumption of Software", Smartgreens 2016, Apr. 2016, Rome, Italy, pp. 417-424, retrived from https://hal.archives-ouvertes.fr/hal-01314070/document.

(Continued)

*Primary Examiner* — Sanjiv Shah
*Assistant Examiner* — Edward Waddy, Jr.
(74) *Attorney, Agent, or Firm* — Brooks, Cameron & Huebsch, PLLC

(57) ABSTRACT

Memory bank redistribution based on power consumption of multiple memory banks of a memory die can provide an overall reduced power consumption of a memory device. The respective power consumption of each bank can be determined and memory operations to the banks can be distributed based on the determined power consumption. The memory die can include an interface coupled to each bank. Control circuitry can remap logical to physical addresses of the banks based on one or more parameters such as a power consumption of each bank, counts of memory operations for each bank, and/or a relative physical distance of each bank.

16 Claims, 5 Drawing Sheets

(56) References Cited

U.S. PATENT DOCUMENTS

2020/0243154 A1* 7/2020 Sity .................... G06F 11/1068

OTHER PUBLICATIONS

"Calculating Memory Power for DDR4 SDRAM", Micron Technical Note, 2017, pp. 1-28, retrieved from https://www.micron.com/-/media/client/global/documents/products/technical-note/dram/tn4007_ddr4_power_calculation.pdf.

* cited by examiner

DETERMINING A RESPECTIVE POWER CONSUMPTION OF EACH OF A PLURALITY OF BANKS OF A MEMORY DEVICE ⎯550

DISTRIBUTING MEMORY OPERATIONS TO THE PLURALITY OF BANKS BASED ON THE RESPECTIVE POWER CONSUMPTION ⎯552

BANK REDISTRIBUTION BASED ON
POWER CONSUMPTION

TECHNICAL FIELD

The present disclosure relates generally to memory devices, and more particularly, to apparatuses and methods related to a bank redistribution based on power consumption.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM) such as dynamic random access memory (DRAM), an example of which is synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices.

DETAILED DESCRIPTION

Figure 1:
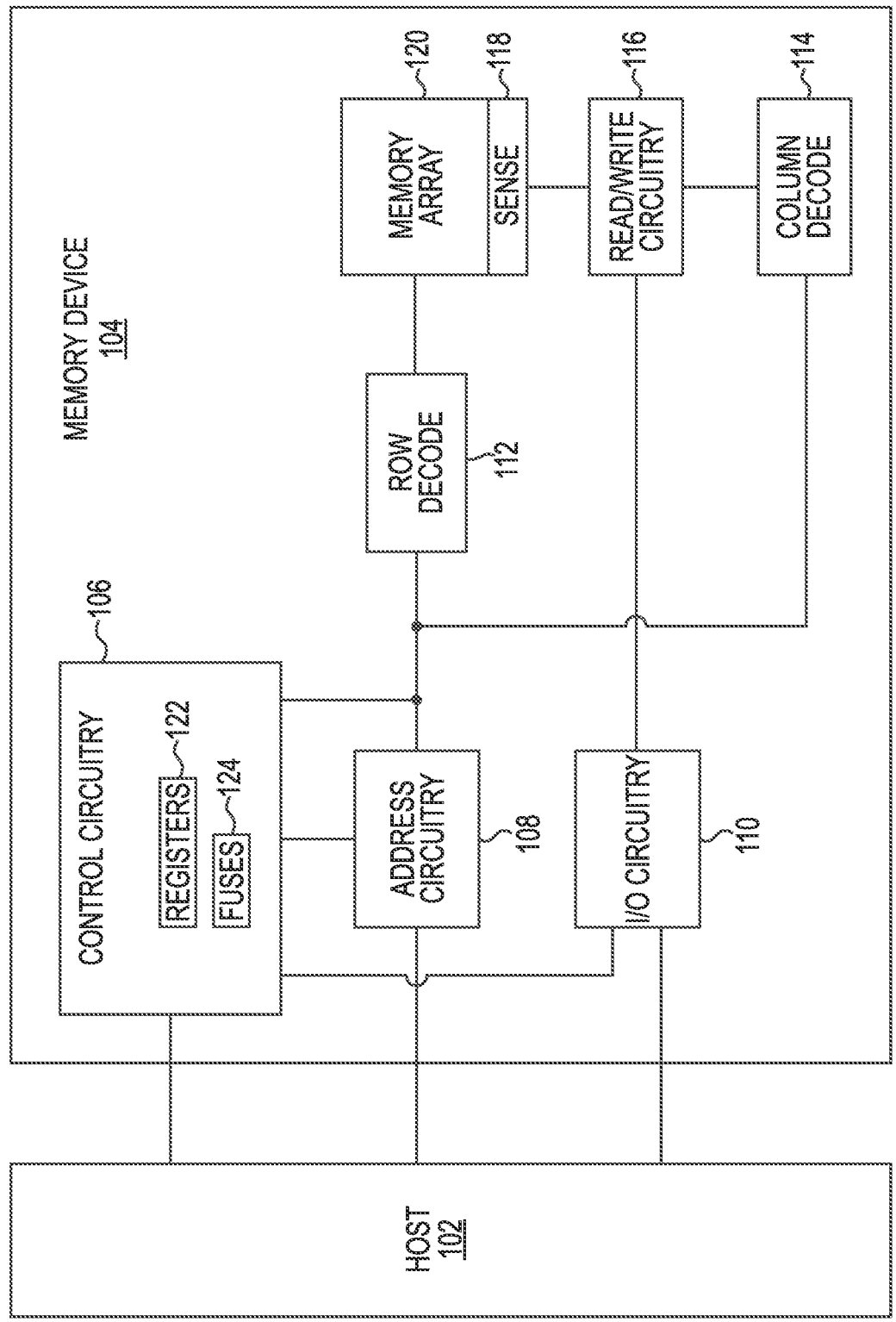
FIG. 1 is a block diagram of an apparatus in the form of a memory device according to the present disclosure.

The present disclosure includes apparatuses and methods related to bank redistribution based on power consumption. Bank redistribution refers to changing the distribution of memory operations to physical banks of memory within a memory device. Power consumption refers to the power used by each of the banks in performing memory operations. Power consumption may be measured and/or modeled for each bank or may be based on testing or historical data for operation of the memory device. Various parameters can be used as a surrogate for relative power consumption by the banks (e.g., instead of directly measuring power consumption). Examples of such parameters include relative quantities of memory operations per memory bank and distance of each memory bank from an interface, among others.

Additional power savings in memory operations is desired in memory solutions that support wide and varying applications. Such power savings may be emphasized for mobile devices and/or automotive use of memory devices. For example with respect to the use of memory devices in the automotive space, software updates may be implemented while the automobile is not connected to an external power supply (e.g., when the automobile is draining its battery). Any power savings that can be achieved (even for memory components of the automobile) are desirable to improve the overall battery life and thus performance of the system.

Some memory devices are provided with a common or similar physical layout of memory banks for differing speeds and technologies of the memory device. For example, subsequent generations of a low power DRAM (LPDRAM) memory device may use the same physical layout of memory banks even if the process by which the banks were fabricated changed between generations. As another example, different memory devices that operate at different speeds may have a common or similar physical layout of memory banks.

Various solutions have been proposed or used to reduce power consumption. Some approaches designed to achieve power savings in the operation of memory devices trade performance (e.g., reduce speed) to yield lesser power consumption. For example, operating voltages or frequencies may be reduced, delay-locked loops (DLLs) may be removed, etc. Some approaches seek reduced power consumption by adding functionality to the memory device (e.g., temperature compensated self-refresh, partial array self-refresh, deep power down, etc.). Some approaches reduce drive strength (e.g., reduce alternating current (AC) switching current or provide a lower power consuming interface). Some approaches seek to reduce bus loading (e.g., package-on-package structure, data bus inversion, lower common input/output (CIO), etc.).

In order to address these and other issues associated with some previous approaches, at least one embodiment of the present disclosure shifts the distribution of memory operations provides to the banks of a memory device such that the banks with lesser relative power consumption receive more traffic (memory operations). Relative power consumption by the banks can be modeled or tracked or learned by the memory device. For a particular application that used the memory device, a logical address of a bank to which most operations can be determined and then remapped to a physical address of a bank having a least relative power consumption. The logical address may also be referred to as a host address. The remapping can occur by the memory device without changing the addressing (logical addressing) used by the host. In some embodiments, memory operations can be distributed to each bank in proportion to the power consumption of each bank. Testing of implementations of various embodiments of the present disclosure have shown power savings for memory device operation on the order of five to fifteen percent for different applications being executed using the memory as primary storage. Additional embodiments and advantages are described in more detail below.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 330 may reference element "30" in FIG. 3B, and a similar element may be referenced as 430 in FIG. 4B. Analogous elements within a Figure may be referenced with a hyphen and extra numeral or letter. Such analogous elements may be generally referenced without the hyphen and extra numeral or letter. For example, elements 332-0, 332-1, . . . , 332-Y in FIG. 3A may be collectively referenced as 332. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a memory device 104 according to the present disclosure. The memory device 104 is coupled to a host 102 via an interface. As used herein, a host 102, a memory device 104, or a memory array 120, for example, might also be separately considered to be an "apparatus." The interface can pass control, address, data, and other signals between the memory device 104 and the host 102. The interface can include a command bus (e.g., coupled to the control circuitry 106), an address bus (e.g., coupled to the address circuitry 108), and a data bus (e.g., coupled to the input/output (I/O) circuitry 110). In some embodiments, the command bus and the address bus can be comprised of a common command/ address bus. In some embodiments, the command bus, the address bus, and the data bus can be part of a common bus. The command bus can pass signals between the host 102 and the control circuitry 106 such as clock signals for timing, reset signals, chip selects, parity information, alerts, etc. The address bus can pass signals between the host 102 and the address circuitry 108 such as logical addresses of memory banks in the memory array 120 for memory operations. The interface can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some cases, the control circuitry 106 is a register clock driver (RCD), such as RCD employed on an RDIMM or LRDIMM.

The memory device 104 and host 102 can be a personal laptop computer, a desktop computer, a digital camera, a mobile telephone, a memory card reader, or an Internet-of-Things (IoT) enabled device, an automobile, among various other types of systems. For clarity, the system has been simplified to focus on features with particular relevance to the present disclosure. The host 102 can include a number of processing resources (e.g., one or more processors, microprocessors, or some other type of controlling circuitry) capable of accessing the memory device 104.

The memory device 104 can provide main memory for the host 102 or can be used as additional memory or storage for the host 102. By way of example, the memory device 104 can be a dual in-line memory module (DIMM) including memory devices 108 operated as double data rate (DDR) DRAM, such as DDR5, a graphics DDR DRAM, such as GDDR6, or another type of memory system. Embodiments are not limited to a particular type of memory device 104. Other examples of memory devices 104 include RAM, ROM, SDRAM, LPDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The control circuitry 106 can decode signals provided by the host 102. The control circuitry 106 can also be referred to as a command input and control circuit and can represent the functionality of different discrete ASICs or portions of different ASICs depending on the implementation. The signals can be commands provided by the host 102. These signals can include chip enable signals, write enable signals, and address latch signals, among others, that are used to control operations performed on the memory array 120. Such operations can include data read operations, data write operations, data erase operations, data move operations, etc. The control circuitry 106 can comprise a state machine, a sequencer, and/or some other type of control circuitry, which may be implemented in the form of hardware, firmware, or software, or any combination of the three.

Data can be provided to and/or from the memory array 120 via data lines coupling the memory array 120 to input/output (I/O) circuitry 110 via read/write circuitry 116. The I/O circuitry 110 can be used for bi-directional data communication with the host 102 over an interface. The read/write circuitry 116 is used to write data to the memory array 120 or read data from the memory array 120. As an example, the read/write circuitry 116 can comprise various drivers, latch circuitry, etc. In some embodiments, the data path can bypass the control circuitry 106.

The memory device 104 includes address circuitry 108 to latch address signals provided over an interface. Address signals are received and decoded by a row decoder 112 and a column decoder 114 to access the memory array 120. Data can be read from memory array 120 by sensing voltage and/or current changes on the sense lines using sensing circuitry 118. The sensing circuitry 118 can be coupled to the memory array 120. The memory array 120 can represent multiple banks of memory, illustrated in more detail in FIGS. 3A-4B. The sensing circuitry 118 can comprise, for example, sense amplifiers that can read and latch a page (e.g., row) of data from the memory array 120. Sensing (e.g., reading) a bit stored in a memory cell can involve sensing a relatively small voltage difference on a pair of sense lines, which may be referred to as digit lines or data lines.

The memory array 120 can comprise memory cells arranged in rows coupled by access lines (which may be referred to herein as word lines or select lines) and columns coupled by sense lines (which may be referred to herein as digit lines or data lines). Although the memory array 120 is shown as a single memory array, the memory array 120 can represent a plurality of memory array arraigned in banks of the memory device 104. The memory array 120 can include a number of memory cells, such as volatile memory cells (e.g., DRAM memory cells, among other types of volatile memory cells) and/or non-volatile memory cells (e.g., RRAM memory cells, among other types of non-volatile memory cells).

The control circuitry 106 can also include a number of registers 122 (e.g., mode registers), fuse options 124, and/or an on-die storage array (not specifically illustrated) that store default settings for the memory array 120 that can be changed by operation thereof. The registers 122 can be read and/or written based on commands from the host 102, a controller, and/or control circuitry 106. The registers 122 can include some individual registers that are "reserved for future use" (RFU) as part of a device specification. The RFU registers can be used to fill the role described herein for the registers 122. For example, the registers 122 can, at least initially, store values indicative of default logical to physical address mappings for memory banks (indicated generally by the memory array 120). Those values can be changed by rewriting the registers 122.

In some embodiments, the memory device 104 can be configured to write a logical address to a particular register 122. The logical address can be that which will have a greatest memory operation load from an application to be executed by the host 102 using the memory device 104 as primary storage. In some embodiments, the control circuitry 106 can be configured to write a logical address to the particular register 122. The logical address can be that which has a greatest count of memory operations over an initial period. In either case, the control circuitry 106 can be configured to remap the physical address of a memory bank closest to an interface to the logical address stored in the particular register 122.

The fuse options 124 block represents fuses or anti-fuses (e.g., read only memory with bits set or changed by operation of the fuses or anti-fuses). In some embodiment, the fuse options 124 can be coupled to the registers 122. In some embodiments, there is a respective fuse option 124 associated with each memory bank. The control circuitry 106 can be configured to activate the respective fuse option 124 associated with a particular memory bank having a particular physical address to remap it from an originally mapped logical address to a different logical address, as described herein. For example, the control circuitry 106 can be configured to activate the respective fuse option in response to a count associated with the particular bank reaching a threshold count. In some embodiments, the control circuitry 106 is configured to remap default logical addresses of memory banks physical addresses of banks closest to the interface in an order in which the respective fuse options are activated as is described in more detail herein.

In at least one embodiment, the control circuitry 106 can be configured to receive an indication of a memory operation load from the host 102. The memory operation load is based on an application to be executed. The memory operation load can be derived from a memory usage model applied to the application. The memory operation load can be a quantity of memory operations for each of a plurality of logical addresses corresponding to memory banks. In some embodiments, the bank logical addresses are less specific portions of a more specific (e.g., longer) logical address. In some embodiments, the bank logical addresses comprise the entire logical address. The memory operation load can be broken down in to relative loads for each memory bank of a memory die comprising the memory array 120 by correlation between the logical addresses received from the host 102 and the physical addresses of the memory banks according to a logical to physical translation table stored in the memory device 104.

Figure 2A:
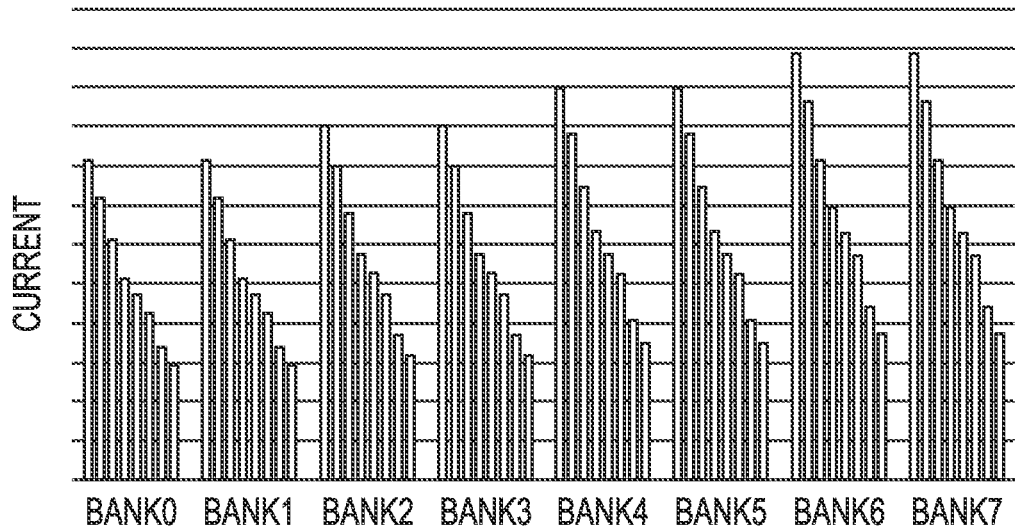
FIG. 2A is a plot of power consumption of different memory banks operated at different speeds during write operations.

FIG. 2A is a plot of power consumption of different memory banks operated at different speeds during write operations. The vertical axis of the plot is current. The bar graphs along the horizontal axis, for each bank (BANK0, BANK1, BANK2, BANK3, BANK4, BANK5, BANK6, BANK7) represent the current used at each of eight different speeds (faster to slower from left to right). Each of the banks is part of a same memory device and shares a same interface of the memory device with the other banks. The different speeds can represent different operating speeds (e.g., frequencies) of the same memory device, or different operating speeds of different memory devices having the same physical arrangement of banks with respect to the interface of the memory device. The speeds associated with respective bars in the bar graphs for each bank are the same for the different banks. The first (left-most) bar for each bank is the same for each of BANK0, BANK1, . . . , BANK7. The same is true for the second bar, the third bar, and so on.

As is shown in FIG. 2A and as may be expected, banks of memory operated at greater speeds have greater power consumption (evidenced by the greater current according to the bar graphs). However, the power consumption for different banks of memory operated at the same speed is different. In this example, the power consumption for BANK6 and BANK7 for each speed, is greater than that for BANK 4 and BANK5, which is greater than that for BANK 2 and BANK3, which is greater than that for BANK0 and BANK1. The power consumption for BANK6 for each speed is roughly equal to that of BANK7. The power consumption for BANK4 for each speed is roughly equal to that of BANK5. The power consumption for BANK2 for each speed is roughly equal to that of BANK3. The power consumption for BANK0 for each speed is roughly equal to that of BANK1. However, for layouts of banks of memory different than that illustrated, the power consumption for each bank of memory may be different.

Figure 2B:
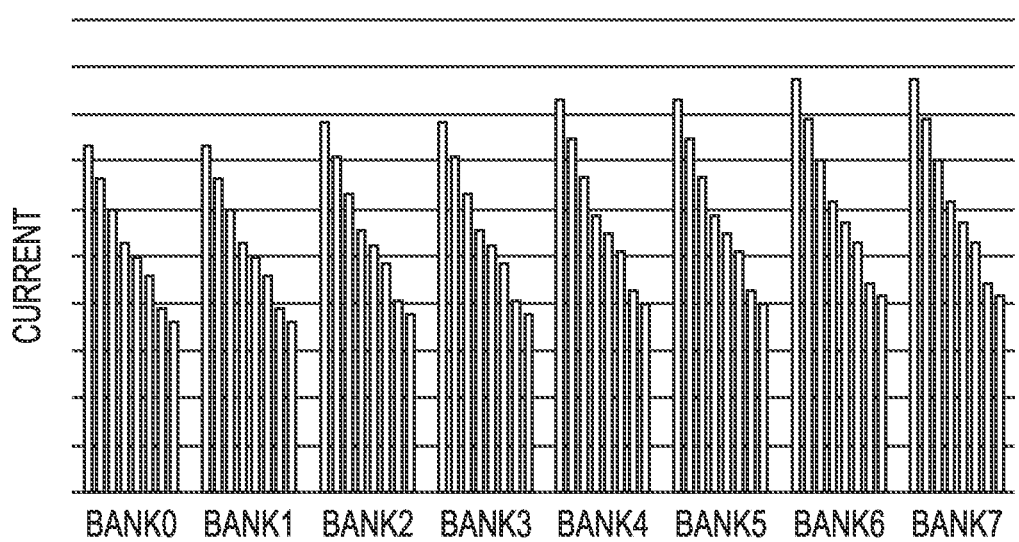
FIG. 2B is a plot of power consumption of different memory banks operated at different speeds during read operations.

FIG. 2B is a plot of power consumption of different memory banks operated at different speeds during read operations. The plot is analogous to that shown in FIG. 2A, except that the power consumption data is for read operations rather than for write operations. Similar to FIG. 2A, the power consumption for different banks of memory operated at the same speed is different. In this example, the power consumption for BANK6 and BANK7 for each speed, is greater than that for BANK 4 and BANK5, which is greater than that for BANK 2 and BANK3, which is greater than that for BANK0 and BANK1. The power consumption for BANK6 for each speed is roughly equal to that of BANK7. The power consumption for BANK4 for each speed is roughly equal to that of BANK5. The power consumption for BANK2 for each speed is roughly equal to that of BANK3. The power consumption for BANK0 for each speed is roughly equal to that of BANK1. As will be illustrated in FIGS. 3A-4B, an explanation for the difference in power consumption for different banks can be explained by the physical layout of the memory device. However, for layouts of banks of memory different than that illustrated, the power consumption for each bank of memory may be different.

Figure 3A:
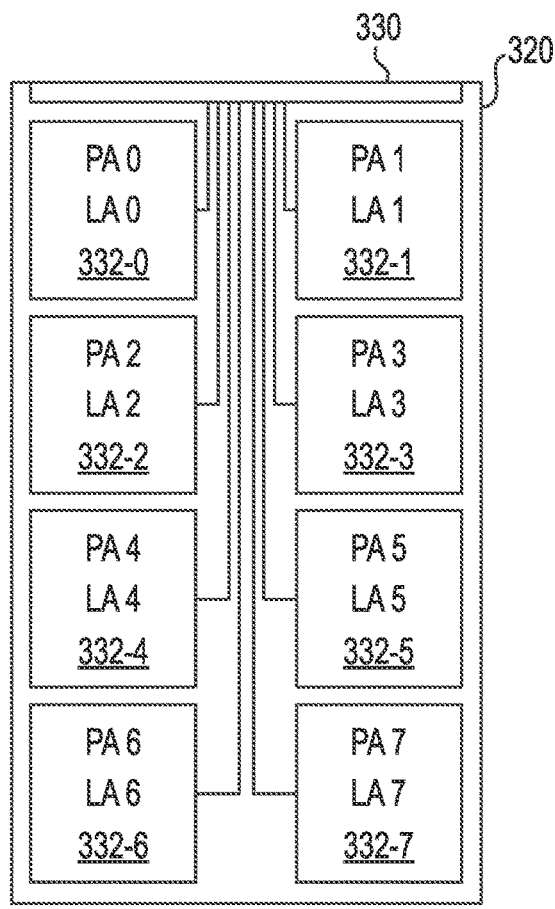
FIG. 3A is as block diagram of memory banks having default logical to physical addressing.

FIG. 3A is as block diagram of memory banks 332 having default logical to physical addressing. The memory banks 332 can collectively form a memory array 320, however embodiments are not so limited. The memory banks 332 are on a same die that has an interface 330. The interface 330 may be referred to in the art as a contact pad or a DQ bus. Each bank 332 can be individually coupled to the interface 330, as illustrated. In some embodiments, the memory banks can be individually addressed and individually operated.

Each bank 332 has a physical address and a logical address. Specifically, bank 332-0 has physical address "PA 0" and logical address "LA 0". Bank 332-1 has physical address "PA 1" and logical address "LA 1". Bank 332-2 has physical address "PA 2" and logical address "LA 2". Bank 332-3 has physical address "PA 3" and logical address "LA 3". Bank 332-4 has physical address "PA 4" and logical address "LA 4". Bank 332-5 has physical address "PA 5" and logical address "LA 5". Bank 332-6 has physical address "PA 6" and logical address "LA 6". Bank 332-7 has physical address "PA 7" and logical address "LA 7". The example illustrated in FIG. 3A represents default logical to physical addressing.

Figure 3B:
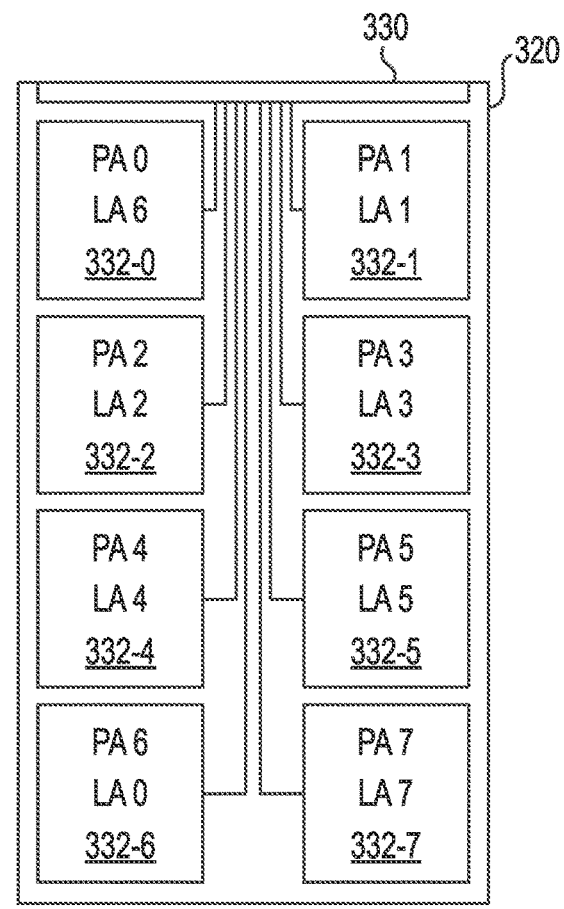
FIG. 3B is a block diagram of memory banks having remapped logical to physical addressing according to the present disclosure.

FIG. 3B is a block diagram of memory banks 332 having remapped logical to physical addressing according to the present disclosure. The array 320, interface 330, and banks 332 are analogous to those illustrated in FIG. 3A, except that at least one logical address has been remapped. Specifically, the logical addresses of the bank 332-0 and the bank 332-6 have been remapped as compared to FIG. 3A. Bank 332-0 has physical address "PA 0" and remapped logical address "LA 6" while bank 332-6 has physical address "PA 6" and remapped logical address "LA 0". In other words, the logical address "LA 0" that was previously mapped to bank 332-0 has been remapped to bank 332-6 and the logical address "LA 6" that was previously mapped to bank 332-6 has been remapped to the bank 332-0. The remainder of the logical to physical mappings for banks 332-1, 332-2, 332-3, 332-4, 332-5, 332-7 remain in the default state illustrated in FIG. 3A.

By way of example, control circuitry of the memory device can receive an indication that the memory operation load from an application to be executed will be greatest for a particular logical address (e.g., logical address "LA 6"). Control circuity can remap the physical address "PA 0" of a memory bank 332-0 closest to the interface 330 to the logical address "LA 6". In some embodiments, the remapping can include the control circuitry performing a one-time fuse or anti-fuse activation, for example, as described above with respect to FIG. 1. In order to preserve the overall logical address structure, the control circuitry can also remap the physical address "PA 6" of the memory bank 332-6 to the logical address previously mapped to the bank 332-0, as illustrated. As another example, the same remapping could occur based on counting operations for the banks 332 during an initial period and determining that the bank 332-6 had a greatest count associated therewith during the initial period.

Figure 4A:
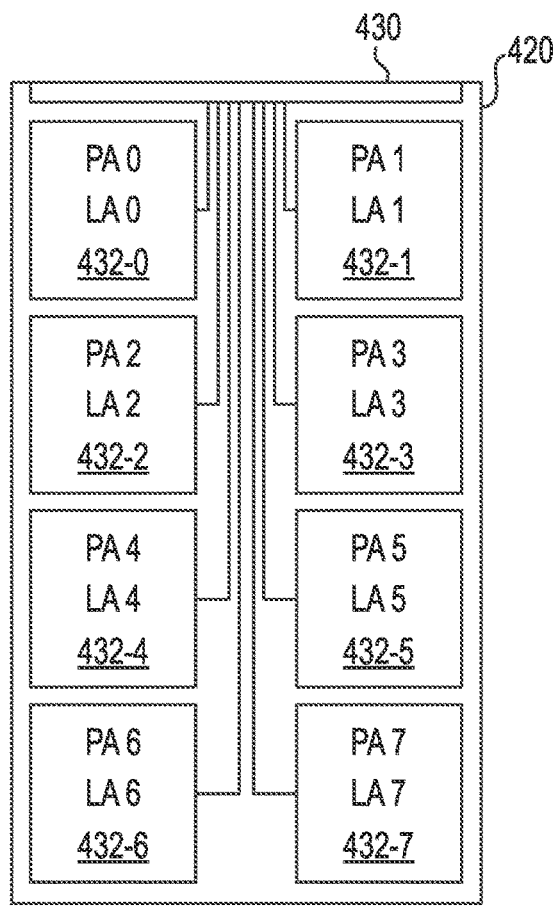
FIG. 4A is as block diagram of memory banks having default logical to physical addressing.

FIG. 4A is as block diagram of memory banks 432 having default logical to physical addressing. The memory banks 432 can collectively form a memory array 420, however embodiments are not so limited. The memory banks 432 are on a same die that has an interface 430. Each bank 432 is individually coupled to the interface 430, as illustrated. Each bank 432 has a physical address and a logical address. Specifically, bank 432-0 has physical address "PA 0" and logical address "LA 0". Bank 432-1 has physical address "PA 1" and logical address "LA 1". Bank 432-2 has physical address "PA 2" and logical address "LA 2". Bank 432-3 has physical address "PA 3" and logical address "LA 3". Bank 432-4 has physical address "PA 4" and logical address "LA 4". Bank 432-5 has physical address "PA 5" and logical address "LA 5". Bank 432-6 has physical address "PA 6" and logical address "LA 6". Bank 432-7 has physical address "PA 7" and logical address "LA 7". The example illustrated in FIG. 4A represents default logical to physical addressing.

Figure 4B:
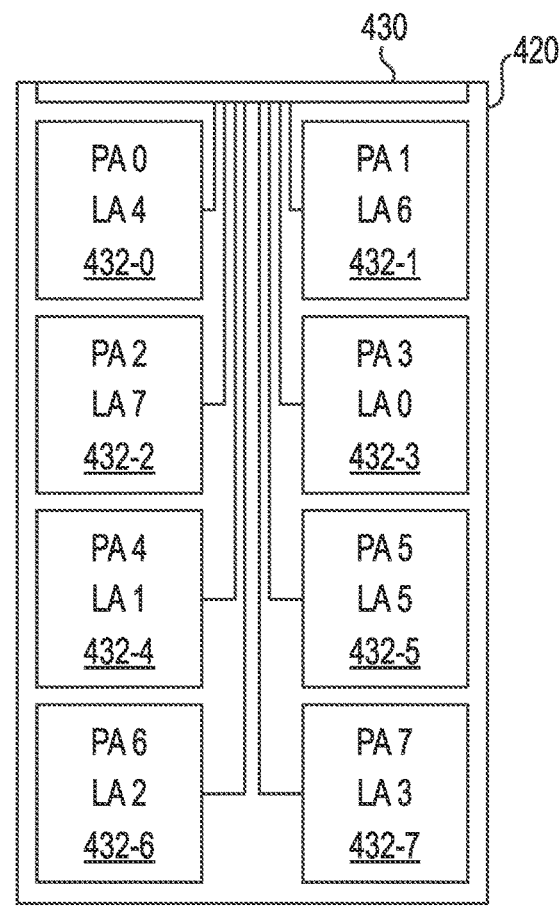
FIG. 4B is a block diagram of memory banks having remapped logical to physical addressing according to the present disclosure.

FIG. 4B is a block diagram of memory banks having remapped logical to physical addressing according to the present disclosure. The array 420, interface 430, and banks 432 are analogous to those illustrated in FIG. 4A, except that the logical addresses have been remapped. Bank 432-0 has remapped logical address "LA 4". Bank 432-1 has remapped logical address "LA 6". Bank 432-2 has remapped logical address "LA 7". Bank 432-3 has remapped logical address "LA 0". Bank 432-4 has remapped logical address "LA 1". Bank 432-6 has remapped logical address "LA 2". Bank 432-7 has remapped logical address "LA 3". Bank 432-5 retains its default logical address "LA 5".

By way of example, control circuitry of the memory device can receive indications of a respective memory operation load from an application to be executed for each logical address (e.g., "LA 0" to "LA 6"). Control circuity can remap the physical addressing of each of the banks 432 based on the indications such that the relative memory operation load for each bank is proportional to a respective distance of each of the plurality of banks from the interface. For example, the following logical addresses can be in order of greatest access load to least access load (targeted or counted): "LA 4", "LA 6", "LA 7", "LA 0", "LA 1", "LA 5", "LA 2", "LA 3". Thus, as illustrated in the example of FIG. 4B, "LA 4" is remapped to "PA 0" corresponding to the bank 432-0, "LA 6" is remapped to "PA 1" corresponding to the bank 432-1, "LA 7" is remapped to "PA 2" corresponding to the bank 432-2, "LA 0" is remapped to "PA 3" corresponding to the bank 432-3, "LA 1" is remapped to "PA 4" corresponding to the bank 432-4, "LA 5" is remapped to "PA 5" corresponding to the bank 432-5, "LA 2" is remapped to "PA 6" corresponding to the bank 432-6, and "LA 3" is remapped to "PA 7" corresponding to the bank 432-7. In this example, although bank 432-5 retains its default logical address "LA 5", it is still considered to have been remapped because the logical address "LA 5" was reassigned to it based on bank access load.

Figures 5, 6:
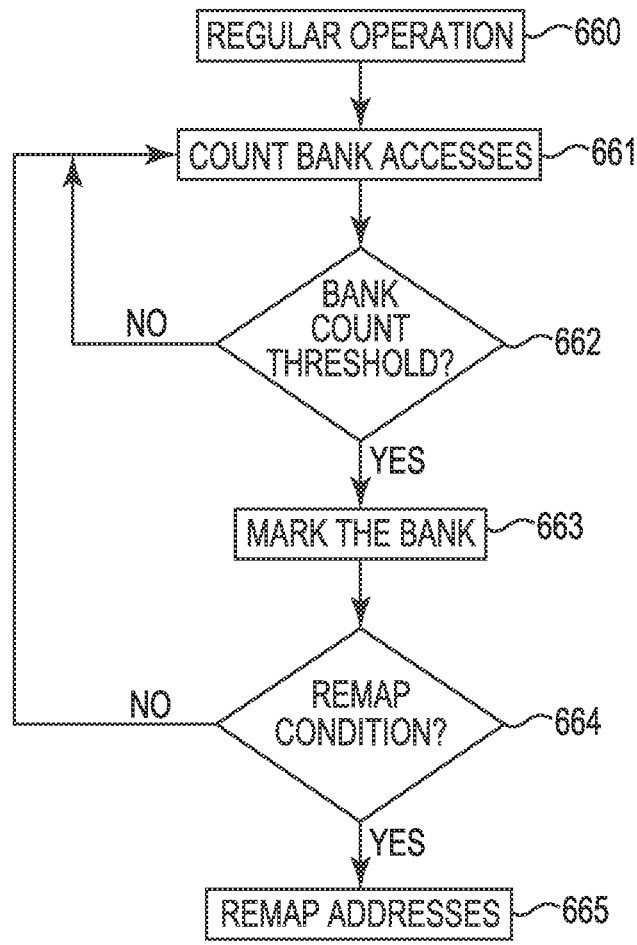
FIG. 5 is a flow diagram illustrating a method for bank redistribution based on power consumption according to the present disclosure.
FIG. 6 is a flow diagram illustrating an example of a memory bank remapping operation process according to present disclosure.

FIG. 5 is a flow diagram illustrating a method for bank redistribution based on power consumption according to the present disclosure. The method described in FIG. 5 can be performed by, for example, a memory device, such as the memory device 104 illustrated in FIG. 1. At block 550, the method can include determining a respective power consumption of each of a plurality of banks of a memory device. Determining the respective power consumption can include prospectively determining the power consumption of each of the banks based on an application to be executed using the memory device. The host 102 illustrated in FIG. 1 can execute an application using the memory device 104 as primary storage for execution of the application. The application can target logical addresses for memory operations. The logical addresses can include, point to, or be associated with memory banks (e.g., by virtue of a logical address more specific than a bank nonetheless indicating a portion of memory corresponding to the memory bank). Based on the application instructions, it can be determined which memory addresses will be more heavily accessed than others by execution of the application. As a result, it can be determined which memory banks will use more power than others according to a default logical to physical addressing scheme. Such a determination can be made, for example, at initialization of the memory device.

At block 552, the method can include distributing memory operations to the plurality of banks based on the respective power consumption. Distributing memory operations can be done by remapping addresses of the banks based on the respective relative memory operation load for each bank. In at least one embodiment, remapping can occur before the application is executed. The remapping can be done such that the application addresses each bank based on the relative memory operation load for each bank in proportion to a respective distance of each of the banks from an interface, such as the interface 430 illustrated in FIG. 4B. Banks closer to the interface can be remapped to logical addresses that are targeted for a greater quantity of memory operations by the application and banks farther from the interface can be remapped to logical addresses that are targeted for a lesser quantity of memory operations by the application. As a result, at least one embodiment of the present disclosure advantageously reduces overall power consumption by the memory device versus default mapping for execution of the application.

Although not specifically illustrated in FIG. 5, in at least one embodiment, the method can include operating the memory device with default addressing of the banks during an initial period. The respective power consumption can be determined retrospectively during or after the initial period. Retrospectively determining the power consumption can include the memory device counting operations for each bank during the initial period. Such memory operations can include one or more of accesses, reads, and writes for each bank. The determined respective power consumption is based on and proportionate to the count of memory operations for each bank. Memory operations can be distributed to the banks based on the determined power consumption after the initial period. The distribution based on power consumption can be achieved by remapping addresses of the banks based on the respective count of operations for each bank in proportion to a respective distance of each bank from the interface. In at least one embodiment, the remapping can be performed in response to any of the banks reaching a threshold count. The threshold count can be programmed to the memory device prior to operation of the memory device.

FIG. 6 is a flow diagram illustrating an example of a memory bank remapping operation process according to present disclosure. At least a portion of the process illustrated in FIG. 6 can be performed by a memory device. At 660, the memory device can operate regularly (e.g., with default logical to physical addressing). In some embodiments, a memory die can be operated with default logical to physical address translation during an initial period. At 661, during regular operation, the memory device can count memory operations (e.g., bank accesses or bank read/write count) for each memory bank (e.g., during the initial period). At 662, if the count for any bank reaches a predefined threshold, then that bank can be marked at 663. Marking a bank can include operating a fuse or anti-fuse associated with the bank, changing a value in a mode register associated with the bank, storing a value in separate memory (e.g., static RAM) of a controller or control circuitry, or another means by which control circuitry of the memory device can track the status of the banks. If a threshold count for any bank is not reached, counting bank accesses can continue at 661.

At 664, for a marked bank, a determination can be made whether a remap condition exists. If a remap condition does not exist, then bank accesses can continue to be counted as indicated at 661. If a remap condition does exist, then a logical to physical address of at least one bank can be remapped at 665. For example, a default logical address of at least one bank can be remapped to a physical address of a different bank to which it was originally mapped based on the count after the initial period.

Various remap conditions can be implemented. For example, a remap condition can be the occurrence of any bank being marked. For such a remap condition, each time a bank is marked, a logical to physical address remapping can occur. For example, the first time a bank is marked, the logical address associated therewith can be remapped to a bank closest to an interface. The next time a bank is marked, the logical address associated therewith can be remapped to a next closest bank to the interface, and so on. Another example of a remap condition is the occurrence of a particular quantity of banks (other than one) being marked. For example, remapping can be triggered for every pair of banks that are marked. Such an embodiment can be particularly useful for a memory die such as that illustrated in FIG. 3B where pairs of memory banks are equidistant from an interface. Another example of a remap condition is when at least half of the banks have been marked and triggering a remapping of all of the banks. Such an embodiment can be useful as a balance between waiting for counts for all of the banks and having a sufficient count for most banks in order to best approximate which bank logical addresses will be accessed the most and remapping them accordingly in proportion to a physical distance of the banks from the interface. Another example of a remap condition is the end of the initial period. The initial period can be a predefined length of time, a predefined overall count for all of the banks, or a predefined threshold count for any bank.

Embodiments can include a tangible machine-readable storage medium (also known as a computer-readable medium) on which is stored one or more sets of instructions or software embodying any one or more of the methodologies or functions described herein. In some embodiments, a memory device or a processing device constitutes a machine-readable medium. The term "machine-readable storage medium" includes a single medium or multiple media that store the one or more sets of instructions. The term "machine-readable storage medium" includes any medium that is capable of storing or encoding a set of instructions for execution by the machine and that cause the machine to perform any one or more of the methodologies of the present disclosure. The term "machine-readable storage medium" includes, but is not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    operating a memory device with default addressing of a plurality of banks during an initial period;
    determining a respective power consumption of each of the plurality of banks of the memory device during the initial period; and
    distributing memory operations to the plurality of banks based on the respective power consumption;
    wherein distributing memory operations comprises remapping a respective address of each of the plurality of banks such that an application addresses each of the plurality of banks based on a relative memory operation load for each of the plurality of banks in proportion to a respective distance of each of the plurality of banks from an interface of the memory device.

2. The method of claim 1, wherein determining the respective power consumption comprises determining the respective power consumption of each of the plurality of banks based on an application to be executed using data read from or written to the memory device.

3. The method of claim 1, further comprising determining, at initialization of the memory device, a respective relative memory operation load for each of the plurality of banks.

4. The method of claim 1, wherein the method comprises remapping the respective address of each of the plurality of banks before the application is executed.

5. The method of claim 1, wherein distributing memory operations comprises distributing memory operations after the initial period.

6. The method of claim 1, wherein determining the respective power consumption for each respective bank comprises counting at least one of a group of operations including accesses, reads, and writes for the respective bank; and
    wherein the determined respective power consumption is proportionate to the count.

7. The method of claim 6, wherein the method comprises remapping the respective address of each of the plurality of banks based on a respective count of operations for each of the plurality of banks in proportion to a respective distance of each of the plurality of banks from the interface.

8. The method of claim 7, wherein remapping the respective address of each is performed in response to any of the plurality of banks reaching a threshold count.

9. An apparatus, comprising:
    a memory die, comprising:
        an interface; and
        a plurality of banks of memory, each coupled to the interface; and
    control circuitry coupled to the memory die, wherein the control circuitry is configured to:
        receive, and store in a register, an indication of a memory operation load from an application to be executed for at least one of a plurality of logical addresses;
        wherein the plurality of logical addresses correspond to the plurality of banks; and
        wherein the indication is of a particular logical address that will have a greatest memory operation load from the application; and
    remap a logical to physical addressing of at least one of the plurality of banks based on the indication; and
    remap a physical address of a particular memory bank closest to the interface to the particular logical address according to the indication stored in the register.

10. The apparatus of claim 9, further comprising a respective fuse or anti-fuse associated with each of the plurality of banks; and
    wherein the control circuitry is configured to activate the respective fuse or anti-fuse associated with a different memory bank originally mapped to the particular logical address to remap a physical address of the different memory bank to a different logical address originally mapped to the particular memory bank.

11. The apparatus of claim 9, wherein the register is coupled to the control circuitry;
    wherein the indication is of a particular logical address that will have a greatest memory operation load form the application; and
    wherein the apparatus is configured to write the particular logical address to the register.

12. The apparatus of claim 9, wherein the control circuitry is configured to receive indications of a respective memory operation load for each of the plurality of logical addresses; and
    remap the respective logical to physical addressing of each of the plurality of banks based on the indications such that the relative memory operation load for each of the plurality of banks is proportional to a respective distance of each of the plurality of banks from the interface.

13. An apparatus, comprising:
    a memory die, comprising:
        an interface; and
        a plurality of banks of memory, each coupled to the interface; and
    control circuitry coupled to the memory die, wherein the control circuitry is configured to:
        operate the memory die with default logical to physical address translation during an initial period;
        count memory operations for each of the plurality of banks during the initial period; and
        remap a default logical address of a particular bank to a physical address of a different bank based on the count after the initial period;
        wherein the particular bank has a greatest count associated therewith; and
        wherein the different bank is closest to the interface.

14. The apparatus of claim 13, further comprising a respective fuse or anti-fuse associated with each of the plurality of banks; and
    wherein the control circuitry is configured to activate the respective fuse or anti-fuse in response to the count associated with a corresponding bank reaching a threshold.

15. The apparatus of claim 14, wherein the control circuitry is configured to remap the default logical address for the corresponding bank to a physical address of a bank that:
    is closest to the interface, and
    has not already been remapped; and wherein the control circuitry is configured to remap default logical addresses for corresponding banks in an order in which the respective fuse or anti-fuses are activated.

16. The apparatus of claim 13, wherein the initial period comprises one of a predefined length of time, a predefined overall count for all of the banks, or a predefined threshold count for any of the plurality of banks.

* * * * *